US008222151B2

(12) United States Patent
Liang et al.

(10) Patent No.: US 8,222,151 B2
(45) Date of Patent: Jul. 17, 2012

(54) DOUBLE PATTERNING STRATEGY FOR CONTACT HOLE AND TRENCH IN PHOTOLITHOGRAPHY

(75) Inventors: Ming-Chung Liang, Hsinchu (TW); Chih-Hao Chen, Hsinchu (TW); Yu-Yu Chen, Hsinchu (TW); Hsin-Yi Tsai, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/185,067

(22) Filed: Jul. 18, 2011

(65) Prior Publication Data

US 2011/0275218 A1 Nov. 10, 2011

Related U.S. Application Data

(63) Continuation of application No. 12/873,429, filed on Sep. 1, 2010, now Pat. No. 8,008,206.

(60) Provisional application No. 61/245,447, filed on Sep. 24, 2009.

(51) Int. Cl.
*H01L 21/311* (2006.01)
(52) U.S. Cl. .................. 438/702; 257/E21.577
(58) Field of Classification Search .................. 257/774; 438/618, 637, 396, 702
See application file for complete search history.

(56) References Cited

U.S. PATENT DOCUMENTS

| 5,858,870 | A | 1/1999 | Zheng et al. |
| 6,696,222 | B2 | 2/2004 | Hsue et al. |
| 7,001,833 | B2 | 2/2006 | Bao et al. |
| 7,540,970 | B2 | 6/2009 | Koh et al. |
| 7,871,908 | B2 | 1/2011 | Yatsuda et al. |
| 2003/0059720 | A1 | 3/2003 | Hwang et al. |
| 2004/0175932 | A1 | 9/2004 | Kim et al. |
| 2006/0189051 | A1 | 8/2006 | Kim |
| 2007/0125750 | A1 | 6/2007 | Weng et al. |
| 2007/0197014 | A1* | 8/2007 | Jeon et al. ..................... 438/597 |
| 2007/0231750 | A1 | 10/2007 | Parikh |
| 2008/0081461 | A1 | 4/2008 | Lee et al. |
| 2009/0081864 | A1 | 3/2009 | Matz et al. |
| 2010/0193919 | A1 | 8/2010 | Warrick et al. |

* cited by examiner

*Primary Examiner* — Thao P. Le
(74) *Attorney, Agent, or Firm* — Lowe Hauptman Ham & Berner, LLP

(57) ABSTRACT

A method of lithography patterning includes forming a hard mask layer on a material layer and forming a capping layer on the hard mask layer. The capping layer does not react with oxygen gas during a photoresist ashing process. The capping layer is patterned by using a first resist pattern and a second resist pattern as etch masks. After the capping layer is patterned, the hard mask layer is patterned by using the patterned capping layer as an etch mask.

20 Claims, 6 Drawing Sheets

DOUBLE PATTERNING STRATEGY FOR CONTACT HOLE AND TRENCH IN PHOTOLITHOGRAPHY

CROSS REFERENCE

The present application is a continuation of Ser. No. 12/873,429, filed Sep. 1, 2010, now U.S. Pat. No. 8,008,206, which, in turn, claims priority of U.S. Provisional Patent Application Ser. No. 61/245,447, filed on Sep. 24, 2009. The entire disclosures of the above-listed applications are incorporated herein by reference. The present disclosure is related to the following commonly-assigned U.S. patent applications, the entire disclosures of which are incorporated herein by reference: U.S. application Ser. No. 11/948,444 filed Nov. 30, 2007 by inventors Feng-Cheng Hsu and Chun-Kuang Chen for "DOUBLE PATTERNING STRATEGY FOR CONTACT HOLE AND TRENCH IN PHOTOLITHOGRAPHY", and: U.S. application Ser. No. 12/047,086 filed Mar. 12, 2008 by inventors Feng-Cheng Hsu and Chun-Kuang Chen for "DOUBLE PATTERNING STRATEGY FOR CONTACT HOLE AND TRENCH IN PHOTOLITHOGRAPHY".

BACKGROUND

Semiconductor technologies are continually progressing to smaller feature sizes, for example down to feature sizes of 65 nanometers, 45 nanometers, and below. A patterned photoresist (resist) layer used to produce such small feature sizes typically has a high aspect ratio. Maintaining a desired critical dimension (CD) can be very difficult for various reasons, especially for a resist layer with a high aspect ratio. The double patterning processes have been introduced to form various features with smaller dimensions. However, conventional double patterning processes involve multiple etching processes with high manufacturing cost and low throughput.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
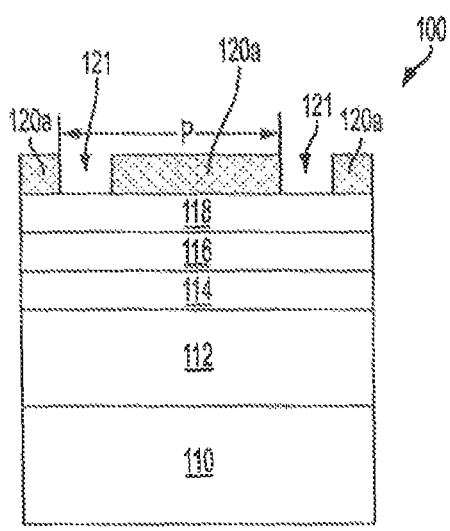
FIGS. 1 through 10 are sectional views of one embodiment of a semiconductor device during various fabrication stages.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 11:
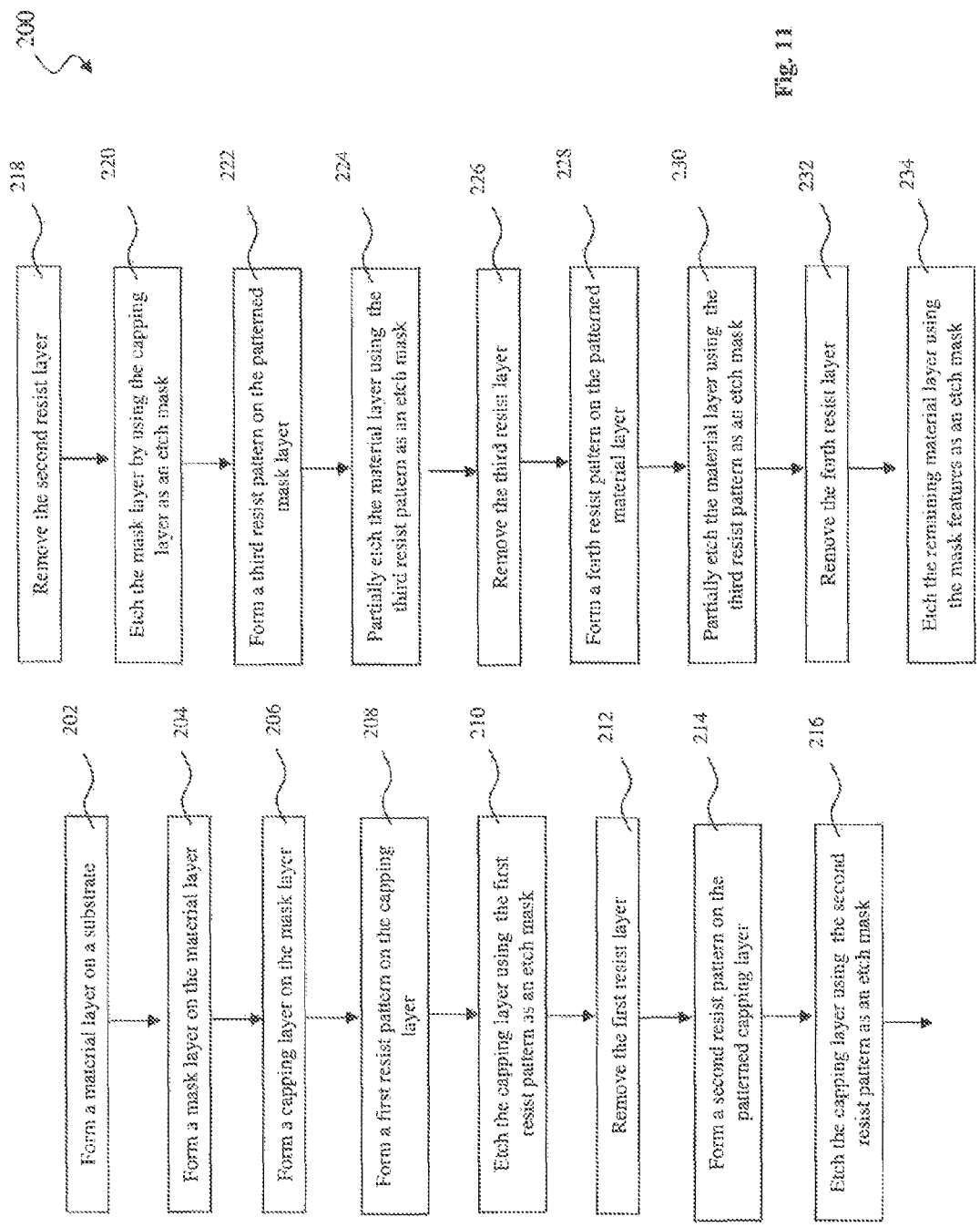
FIG. 11 is a flowchart showing one embodiment of a method for lithography patterning.

Referring to FIGS. 1 and 11, the method 200 may begin at step 202 by forming one or more underlying material layer (also referred to as an "under-material" layer) on a substrate 110. The substrate 110 may be made of silicon, some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate 110 may include a non-semiconductor material such as a glass for thin-film-transistor liquid crystal display (TFT-LCD) devices, or fused quartz or calcium fluoride for a photomask (mask). The substrate 110 may include various doped regions, dielectric features, and multilevel interconnects. In one embodiment, the substrate 110 includes various doped features for various microelectronic components, such as a complementary metal-oxide-semiconductor field-effect transistor (CMOSFET), imaging sensor, memory cell, and/or capacitive element. In another embodiment, the substrate 110 includes conductive material features and dielectric material features configured for coupling and isolating various microelectronic components, respectively. In another embodiment, the substrate 110 includes one or more material layers formed thereon.

The under-material layer may be a single material or layers of different materials. In the embodiment shown in FIGS. 1-10, a material layer 112 is formed on the substrate 110. The material layer 112 may be a dielectric material, such as silicon oxide and/or low dielectric-constant (low-k) material. In other embodiments, the material layer 112 may include silicon, poly-silicon, dielectric material, conductive material or combinations thereof. The material layer 112 may have a thickness ranging between about 100 angstroms and about 9000 angstroms. For example, the material layer 112 may have a thickness ranging between about 1000 angstroms and 3500 angstroms. In one embodiment, the material layer 112 serves as an interlayer dielectric (ILD) or inter-metal dielectric (IMD). The dielectric materials used for ILD or IMD includes silicon oxide and low-k dielectric materials with a dielectric constant less than about 4. Suitable low-k dielectric materials include fluorinated silica glass (FSG), carbon doped silicon oxide, BLACK DIAMOND® (Applied Materials of Santa Clara, Calif.), XEROGEL®, AEROGEL®, amorphous fluorinated carbon, Parylene, BCB (bis-benzocyclobutenes), SILK® (Dow Chemical, Midland, Mich.), polyimide, and/or other proper porous polymeric materials. The dielectric material may be formed by a suitable process including spin-on coating or chemical vapor deposition (CVD).

Still referring to FIGS. 1 and 11, the method 200 proceeds to step 204 by forming a mask layer 114 on the material layer 112. In the present embodiment, the mask layer 114 includes titanium nitride, tantalum nitride, titanium, silicon nitride, silicon carbide, or other suitable material film formed by a suitable process, such as CVD or PVD deposition. The mask layer 114 may have a thickness ranging between about 50 angstroms and about 1000 angstroms. The mask layer 114 can function as a hard mask during a later etching process for patterning the material layer 112 and/or the substrate 110.

Still referring to FIGS. 1 and 11, the method 200 proceeds to step 206 by forming a capping layer 116 on the mask layer 114. The capping layer 116, in one embodiment, will not react with oxygen or oxygen-containing gas during a later photoresist ashing process. The capping layer 116, in another embodiment, may have a limited amount of reaction with oxygen or oxygen-containing gas without substantially changing the dimension of the capping layer 116. The capping layer 116, in another embodiment, may have a reaction with oxygen or oxygen-containing gas, wherein the reaction is less than the amount of reaction between the mask layer 114 and the oxygen or oxygen-containing gas. The capping layer 116, in another embodiment, may function as a protector to prevent top surface of the mask layer 114 being exposed to an environment with oxygen or oxygen-containing gas during the ashing process. The capping layer 116, in one embodiment, includes an oxide material, for example, silicon oxide, silicon oxynitride, or other suitable material film formed by a suitable process, such as CVD deposition. The capping layer 116 may have a thickness ranging between about 50 angstroms and about 1000 angstroms.

A first anti-reflective coating (ARC) layer 118 may be optionally formed on the capping layer 116 to reduce reflection during lithography exposing processes, also referred to as a top anti-reflective coating (TARC) layer or bottom anti-reflective coating (BARC) layer. In one example, the first ARC layer 118 may include organic BARC material formed by a spin-coating technique. The first ARC layer 118 may have a thickness ranging from about 50 angstroms to about 2000 angstroms. The first ARC layer 118 may be eliminated if the mask layer 114 or the capping layer 116 can function as an anti-reflective layer as well.

Still referring to FIGS. 1 and 11, the method 200 proceeds to step 208 by forming a first resist pattern, including a plurality of first resist features 120a and a plurality of first openings 121 defined by the first resist features 120a, on the first ARC layer 118. The first resist pattern, in one embodiment, is a positive tone resist (positive resist) pattern formed by exposing and developing a first positive resist layer. In another embodiment, the first resist pattern is a negative tone resist (negative resist) pattern formed by exposing and developing a first negative resist layer. Preferably, the first resist pattern is a positive resist pattern. The positive resist is characterized as that the exposed regions will be removed by the developing solution. In one embodiment, the positive resist pattern 118 includes chemical amplifier (CA) resist. The CA resist includes photoacid generator (PAG) that can be decomposed to form acid during a lithography exposure process. More acid can be generated as a result of catalytic reaction. As one example of the formation, the first resist layer is formed on the semiconductor device 100 and then patterned by a first lithography process to form the first resist features 120a and the first openings 121 as illustrated in FIG. 1. The first lithography process uses a lithography system and a first mask. The first resist features 120a are formed according to a predetermined integrated circuit pattern in the first mask. In one embodiment, the first resist features 120a include a pitch p, defined as a distance from one feature to adjacent feature of the first resist pattern. The pitch p may range between about 50 nm and about 200 nm. As one example, the pitch is about 100 nm. The first resist pattern may have a thickness ranging between about 500 angstroms and about 5000 angstroms. In various examples, the first resist pattern may have a thickness ranging between about 500 angstroms and about 3000 angstroms, or between about 500 angstroms and about 1500 angstroms. The first lithography process used to form the first resist pattern may include resist coating, exposing, post-exposure baking, and developing. The first lithography process may additionally include soft baking, mask aligning, and/or hard baking.

For illustration, the exposing process may be carried out by exposing the semiconductor device 100 under a radiation beam through the first mask.

Figure 2:
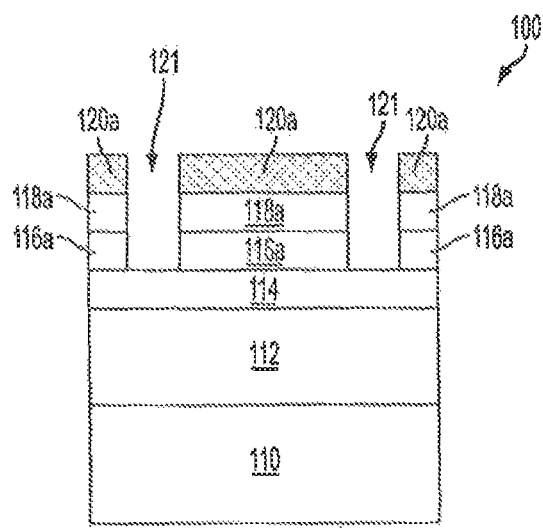

Referring to FIGS. 2 and 11, the method 200 proceeds to step 210 to etch the first ARC layer 118 and the capping layer 116 using the first resist pattern as an etch mask. The first ARC layer 118 is partially covered by the first resist pattern. The uncovered portions of the first ARC layer 118 are removed by a first etching to form a plurality of first ARC features 118a. Portions of the capping layer 116 are exposed after the first etching. The exposed portions of the capping layer 116 are then removed by a second etching to form a plurality of intermediate capping features 116a. The first etching and the second etching could be performed in a single process step or in separated process steps. The process of the second etching is chosen such that the capping layer 116 has a higher etch rate than that of the mask layer 114. Therefore, the uncovered portions of capping layer 116 within the openings 121 are substantially removed during the second etching process. The first ARC layer 118 and the capping layer 116 can be etched by using the gas of $C_xH_yF_z$ (x, z>0, y>=0), $O_2$, $N_2$, Ar, or mixtures thereof.

Figure 3:
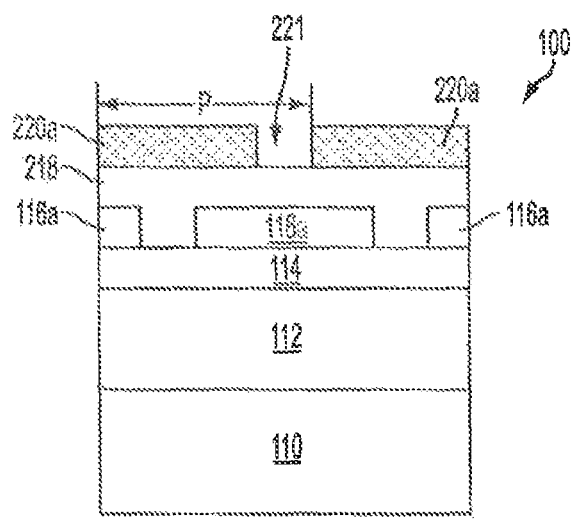

Referring to FIGS. 3 and 11, the method 200 proceeds to step 212 by removing the first resist features 120a and the first ARC features 118a. The first resist features 120a may be removed by implementing a wet stripping and/or plasma ashing known in the art. For example, an oxygen plasma ashing may be implemented to remove the first resist features 120a. Additionally, the first ARC features 118a may also be simultaneously removed by the same plasma ashing process.

Still referring to FIG. 3, a second anti-reflective coating (ARC) layer 218 may additionally be formed within and above the intermediate capping features 116a to form a substantially smooth surface and reduce reflection during a later lithography exposing process. In one example, the second ARC layer 218 may include organic BARC material formed by a spin-coating technique. The second ARC layer 218 may have a thickness ranging from about 50 angstroms to about 2000 angstroms.

Still referring to FIGS. 3 and 11, the method 200 proceeds to step 214 by forming a second resist pattern, including a plurality of second resist features 220a and a plurality of second openings 221 defined by the second resist features 220a, on the second ARC layer 218. The second resist features 220a and the second openings 221 are formed by exposing and developing a second resist layer on the second ARC layer 218. In one embodiment, the second resist layer is a positive resist layer. In another embodiment, the second resist layer is a negative resist layer. Preferably, the second resist layer has the same tone as the first resist layer. The second resist layer is patterned with a second lithography process. In the second lithography process, the second resist layer is exposed by using a second mask with a second predefined pattern and a lithography system. The second lithography process may further include post-exposure baking, developing, and hard baking.

A plurality of exposed resist features and unexposed resist features are formed (not shown) in the second resist layer by the second exposing process. The exposed resist features are then removed by a subsequent developing process to form the second resist features 220a and the second openings 221. The second resist pattern may be formed to have a pitch similar to the pitch P of the first resist pattern. In one embodiment, the second resist features 220a are configured relative to the first resist features 120a to form a combined pattern in the capping layer 116 so to utilize a double patterning structure. For example, at least one of the second openings 220a is positioned above one of the intermediate capping features 116a. For example, each of the second opening 220a is positioned above each of the intermediate patterned capping feature 116a. In another embodiment, the second openings 220a may be substantially aligned to central portions of the intermediate capping features 116a, respectively. Such that, the pitch defined by the first resist features 120a and the second resist features 220a is halved (½ P), resulting in a reduced minimum features size.

Figure 4:
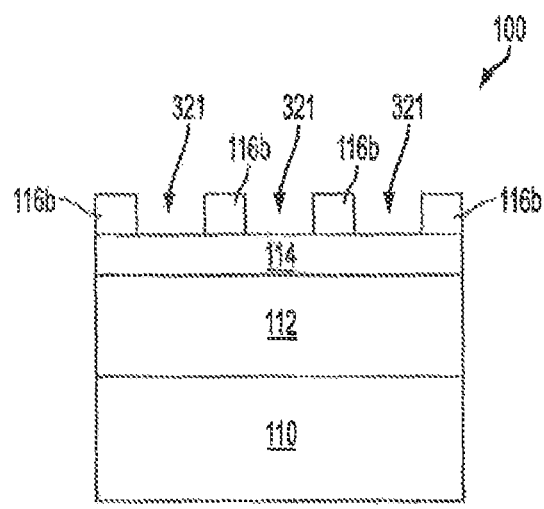

Referring to FIGS. 4 and 11, the method 200 proceeds to step 216 to etch the second ARC layer 218 and the intermediate capping features 116a using the second resist pattern as an etch mask. The second ARC layer 218 is partially uncovered by the second resist pattern. The uncovered portions of the second ARC layer 218 are removed by a third etching to expose portions of the underlying intermediate capping features 116a after the step of third etching. The exposed portions of the intermediate capping features 116a are then removed by a forth etching to form a plurality of final capping features 116b. The third etching and the fourth etching could be performed in a single process step or in separated process steps. The process of the fourth etching is chosen such that the capping layer 116 has a higher etch rate than that of the mask layer 114. Therefore, the capping layer 116 within the openings 221 is substantially removed during the fourth etching process. The second ARC layer 218 and the intermediate capping features 116a can be etched by using the gas of $CxHyFz$ (x, z>0, y>=0), O2, N2, Ar, or mixtures thereof.

Still referring to FIGS. 4 and 11, the method 200 proceeds to step 218 by removing the second resist features 220a and the remaining second ARC layer 218. The second resist features 220a may be removed by implementing a wet stripping and/or plasma ashing known in the art. For example, an oxygen plasma ashing may be implemented to remove the second resist features 220a. Additionally, the remaining second ARC layer 218 may also be simultaneously removed by the same plasma ashing process. A plurality of openings 321 are thus formed within the final capping features. The openings 321 are used to further form various contact holes or trenches in different applications.

Figure 5:
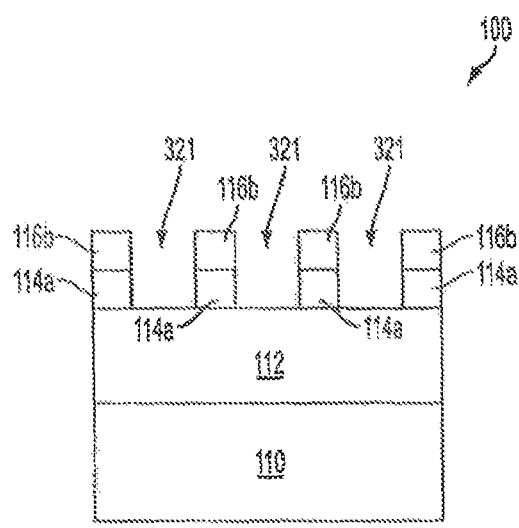

Referring to FIGS. 5 and 11, the method 200 proceeds to step 220 to etch the mask layer 114 by using the final capping features 116b as an etch mask. The process of the etching is chosen such that the mask layer 114 has a higher etch rate than that of the material layer 112. Therefore, the mask layer 114 within the openings 321 is substantially removed during the etching process to form a plurality of mask features 114a. The final capping features 116b may be partially consumed during the etching process. Preferably, the remaining final capping features 116b are sufficient to protect the underlying mask layer during a later ashing process. The mask layer 114 can be etched by using the gas of Cl2, O2, N2, Ar, NF3, SF6, HBr, SiCl4 or mixtures thereof.

Figure 6:
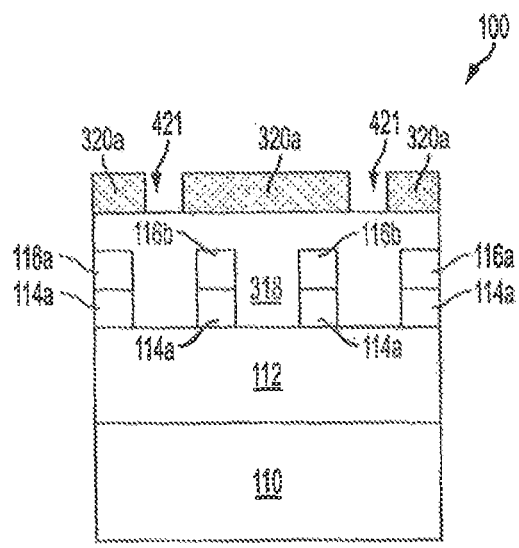

Referring to FIG. 6, a third ARC layer 318 is additionally formed within and above the mask features 114a and the final capping features 116b to form a substantially smooth surface and reduce reflection during a later lithography exposing process. The third ARC layer 318 may have a thickness ranging from about 50 angstroms to about 2000 angstroms. Still referring to FIGS. 6 and 11, the method 200 proceeds to step 222 by forming a third resist pattern, including a plurality of third resist features 320a and a plurality of third openings 421 defined by the third resist features 320a, on the third ARC layer 318. The third resist features 320a and the third openings 421 are formed by exposing and developing a third resist layer on the third ARC layer 318. In one embodiment, the third resist layer is a positive resist layer. In another embodiment, the third resist layer is a negative resist layer. Preferably, the third resist layer has the same tone as the first resist layer. The third resist layer is patterned with a third lithography process by using a third mask with a third predefined pattern and a lithography system. The third openings 421 may be defined to have a dimension less than the first openings 121 or the second openings 221. The third openings 421 may be positioned either above the first openings 121 or above the second openings 221. The third lithography process may further include post-exposure baking, developing, and hard baking.

Figure 7:
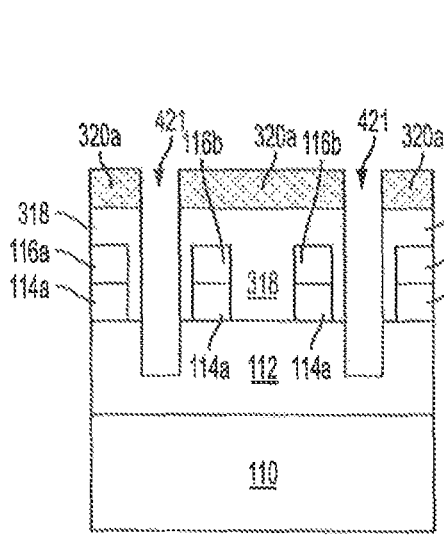

Referring to FIG. 7, the third ARC layer 318 is removed to expose the underlying material layer 112 by using the third resist features 320a as an etch mask. Still referring to FIGS. 7 and 11, the method 200 may proceed to step 224 by partially removing the exposed portions of the material layer 112. The depth of the removed material layer 112 is designed to be substantially the same as a trench line thickness in a final dual damascene structure. The remaining exposed portions of the material layer 112 will be removed during a later etching process. The ratio of the removing portion to the remaining portion can be ranged from about 1 to about 4. Preferably, the ratio of the removing portion to the remaining portion is 2. The material layer 112 can be etched by using the gas of $CxHyFz$ (x, z>0, y>=0), CF3I, CH4, NF3, O2, N2, H2, Ar, or mixtures thereof.

Figure 8:
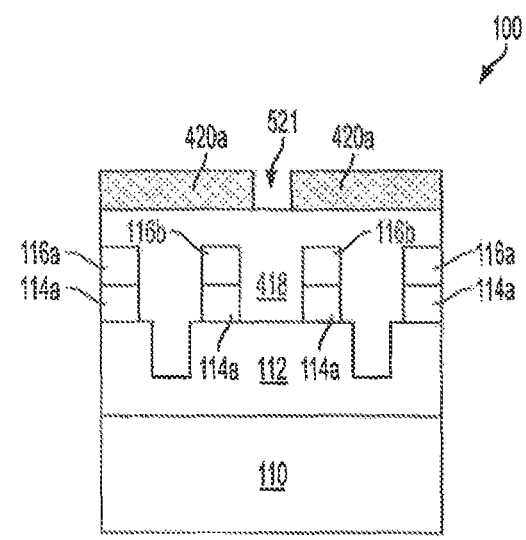

Referring to FIGS. 8 and 11, the method 200 proceeds to step 226 to remove the third resist features 320a and the remaining third ARC layer 318a by implementing a wet stripping and/or plasma ashing known in the art. Still referring to FIGS. 8 and 11, the method 200 proceeds to step 228 by forming a fourth resist pattern, including a plurality of fourth resist features 420a and a plurality of fourth openings 521 defined by the fourth resist features 420a, on a fourth ARC layer 418. The fourth resist features 420a and the fourth openings 521 are formed by exposing and developing a fourth resist layer. In one embodiment, the fourth resist layer is a positive resist layer. In another embodiment, the fourth resist layer is a negative resist layer. Preferably, the fourth resist layer has the same tone as the first resist layer. The fourth resist layer is patterned with a fourth lithography process by using a fourth mask with a fourth predefined pattern and a lithography system. The fourth openings 521 may be defined to have a dimension same as the third openings 421. The fourth openings 521 may be positioned either above the second openings 221 or above the first openings 121, and between the third openings 421. The fourth lithography process may further include post-exposure baking, developing, and hard baking.

Figure 9:
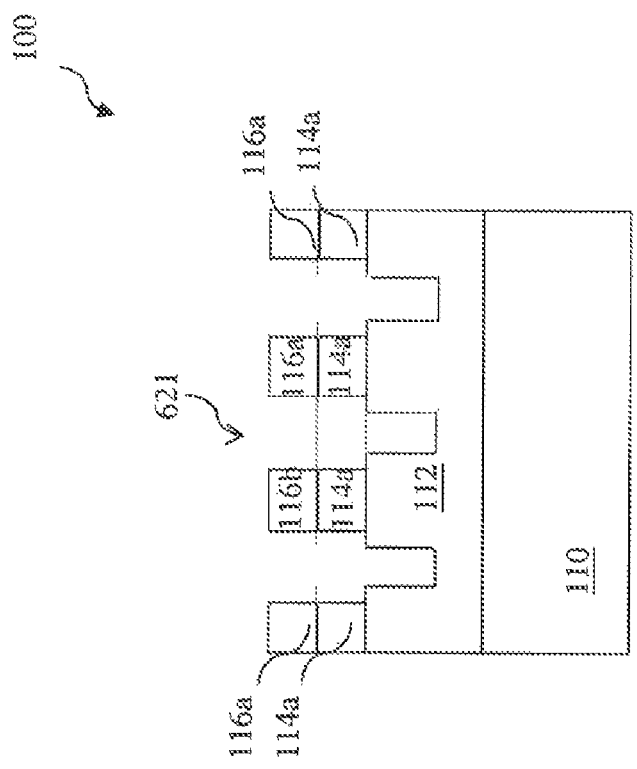

Referring to FIG. 9, the fourth ARC layer 418 is removed to expose the underlying material layer 112 by using the fourth resist features 420a as an etch mask. Referring to FIG. 11, the method 200 may proceed to step 230 by partially removing the exposed portions of the material layer 112. The depth of the removed material layer 112 formed by the step 228 is designed to be substantially the same as the depth formed by the step 224. The remaining exposed portions of the material layer 112 will be removed during a later etching process. Still referring to FIG. 11, the method 200 may proceed to step 232 by removing the fourth resist features 420a and the remaining third ARC layer 418 by implementing a wet stripping and/or plasma ashing known in the art.

Figure 10:
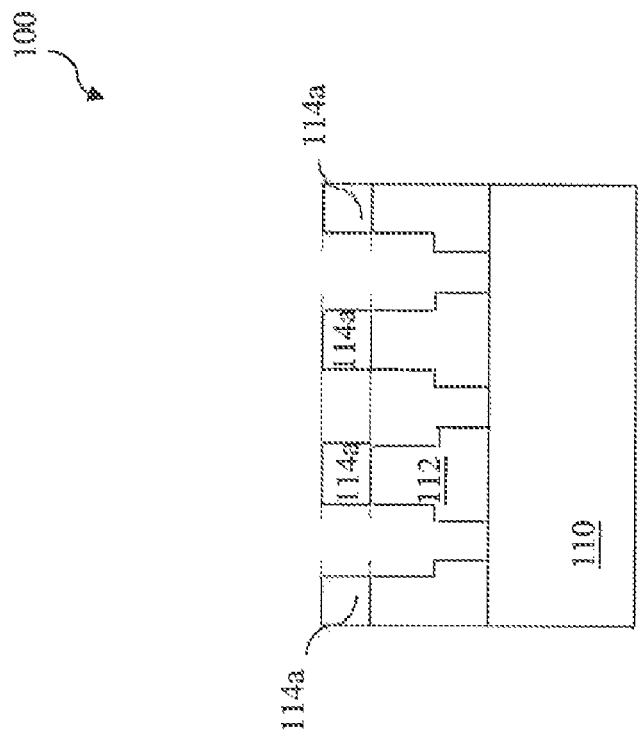

Referring to FIGS. 10 and 11, the method 200 proceeds to step 234 by etching the remaining material layer 112 by using the mask features 114a and/or the final capping features 116b as an etch mask. The final capping features 116b may be partially or all removed during the etching process. The etching process is chosen such that the material layer 112 has a higher etch rate than that of the substrate 110. Therefore, dual damascene structures are formed within the material layer 112. Each damascene structure has one trench line above one contact via hole.

The method described above with reference to FIGS. 1 to 11 provides a double patterning process constructed according to various aspects of the present disclosure. The manufacturing throughput and product quality are enhanced, compared with the conventional double patterning and double etching method. In another example, the method 200 is capable of etching a thicker film since the mask layer 114 can be properly chosen with a higher etch resistance.

Various embodiments of a lithography patterning method 200 have been introduced and described. Other modifications, variations, additions, and extensions may be used without departing from the scope of the disclosure. In one example, a plurality of contact holes are defined by the first positive and second positive resist patterns are formed in the material layer 112. Alternatively, a plurality of trenches may be defined by the first positive and second positive resist patterns are formed in the material layer 112. In another example, the BARC layer and/or mask layer may be eliminated. In another example, the positive and negative resist patterns are directly formed on the substrate 110.

The radiation beam used to expose the first and the second resist layers may be ultraviolet (UV) or EUV, such as a 248 nm beam from a Krypton Fluoride (KrF) excimer laser, or a 193 nm beam from an Argon Fluoride (ArF) excimer laser. The lithography process may utilize other exposing modes or technologies, such as on-axis, off-axis, quadripole, or dipole exposure technologies. The optical exposing process may alternatively be implemented or replaced by other proper methods such as maskless lithography, electron-beam writing, ion-beam writing, and molecular imprint techniques. In another example, the first and second masks used in the method 200 may utilize other mask technologies. For example, the first pattern (or second mask pattern) may be formed in a phase shift mask (PSM). The phase shift mask can print better images than a binary mask.

In one embodiment, the positive resist pattern includes chemical amplifier (CA) resist. In another embodiment, the negative resist layer includes negative resist inert to acid. In furtherance of the embodiment, the negative resist layer includes cyclized synthetic rubber resin, bis-acrylazide, and aromatic solvent. In another embodiment, the positive resist may alternatively include novolac resin, diazonaphthoquinone (DNQ) as photoacitve compound (PAC), and PGME (or PGMEA or ethyl lactate) as solvent. In another example, the negative resist includes silicon-containing material such that the negative resist has an etching resistance greater than that of the positive resist.

The foregoing has outlined features of several embodiments so that those skilled in the art may better understand the above detailed description. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a hard mask layer overlying a substrate;
   forming a capping layer overlying the hard mask layer, the capping layer and the hard mask layer comprising different materials;
   forming a first resist pattern overlying the capping layer;
   etching the capping layer using the first resist pattern as an etch mask to form a first patterned capping layer having a plurality of openings therein;
   removing the first resist pattern;
   forming a second resist pattern overlying the first patterned capping layer;
   etching the first patterned capping layer using the second resist pattern as an etch mask to form a second patterned capping layer having at least one opening therein, wherein the at least one opening is positioned between two of the plurality of openings; and
   removing the second resist pattern;
   wherein the hard mask layer
      is a metal layer, or
      includes titanium nitride, tantalum nitride, titanium, silicon nitride, silicon carbide, or combinations thereof.

2. The method of claim 1, further comprising:
   forming a first anti-reflective coating (ARC) layer before forming the first resist pattern.

3. The method of claim 1, further comprising:
   forming a second ARC layer before forming the second resist pattern.

4. The method of claim 1, wherein the capping layer is an oxygen-containing layer.

5. The method of claim 1, wherein the capping layer includes silicon oxide, silicon oxynitride, or combinations thereof.

6. The method of claim 1, wherein the capping layer has a thickness ranging between about 50 angstroms and about 1000 angstroms.

7. The method of claim 1, wherein the first and the second resist patterns are moved in an ashing process with at least one oxygen-containing gas.

8. The method of claim 7, wherein the thickness of the capping layer is not substantially changed after the ashing process.

9. The method of claim 1, further comprising:
   etching the hard mask layer using the second patterned capping layer as an etch mask.

10. A method of double patterning, comprising:
    forming a material layer overlying a substrate;
    forming a hard mask layer overlying the material layer;
    forming a capping layer overlying the hard mask layer, the capping layer comprising a material different from that of the hard mask layer;
    forming a first resist pattern overlying the capping layer;
    etching the capping layer using the first resist pattern as an etch mask to form a plurality of intermediate capping features;
    removing the first resist pattern by a first ashing process;
    forming a second resist pattern overlying the intermediate capping features;
    etching the intermediate capping features using the second resist pattern as an etch mask to form a plurality of final capping features;
    removing the second resist pattern by a second ashing process; and
    etching the hard mask layer using the final capping features as an etch mask to form a patterned hard mask layer.

11. The method of claim 10, further comprising:
    etching the material layer using the patterned hard mask layer as an etch mask.

12. The method of claim 10, wherein the hard mask layer is a metal layer.

13. The method of claim 10, wherein the hard mask layer includes titanium nitride, tantalum nitride, titanium, silicon nitride, silicon carbide, or combinations thereof.

14. The method of claim 10, wherein the capping layer is an oxygen-containing layer.

15. The method of claim 10, wherein the capping layer includes silicon oxide, silicon oxynitride, or combinations thereof.

16. The method of claim 10, wherein at least one of the first and the second ashing processes uses an oxygen-containing gas.

17. The method of claim 16, wherein the capping layer has substantially no reaction with the oxygen-containing gas in the first or the second ashing process.

18. A method, comprising:
 forming a hard mask layer overlying a substrate;
 forming a capping layer overlying the hard mask layer;
 forming a first resist pattern overlying the capping layer;
 etching the capping layer using the first resist pattern as an etch mask to form a first patterned capping layer having a plurality of openings therein;
 removing the first resist pattern;
 forming a second resist pattern overlying the first patterned capping layer;
 etching the first patterned capping layer using the second resist pattern as an etch mask to form a second patterned capping layer having at least one opening therein, wherein the at least one opening is positioned between two of the plurality of openings;
 removing the second resist pattern
 etching the hard mask layer using the second patterned capping layer as an etch mask to form a patterned hard mask layer; and
 etching the substrate using the patterned metal hard mask layer as an etch mask, without completely removing the second patterned capping layer which remains, at least partially, in a resultant structure obtained after etching the substrate.

19. The method of claim 10, wherein the material layer comprises a material different from that of the hard mask layer.

20. The method of claim 19, wherein the material layer comprises a low dielectric-constant (low-k) material.

* * * * *